(12) United States Patent
Schaedlich et al.

(10) Patent No.: US 10,070,202 B2
(45) Date of Patent: Sep. 4, 2018

(54) ELECTROMECHANICAL ADAPTER FOR COMMUNICATING BETWEEN INTERFACES

(71) Applicant: Robert Bosch GmbH, Stuttgart (DE)

(72) Inventors: Thomas Schaedlich, Kornwestheim (DE); Jochen Weber, Asperg (DE); Chrysanthos Tzivanopoulos, Remseck am Neckar (DE); Sven Bergmann, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 165 days.

(21) Appl. No.: 14/911,341

(22) PCT Filed: Aug. 4, 2014

(86) PCT No.: PCT/EP2014/066714
§ 371 (c)(1),
(2) Date: Feb. 10, 2016

(87) PCT Pub. No.: WO2015/022221
PCT Pub. Date: Feb. 19, 2015

(65) Prior Publication Data
US 2016/0202322 A1  Jul. 14, 2016

(30) Foreign Application Priority Data

Aug. 13, 2013 (DE) .................. 10 2013 215 968

(51) Int. Cl.
*H04Q 9/00* (2006.01)
*H04L 12/40* (2006.01)
(Continued)

(52) U.S. Cl.
CPC .......... *H04Q 9/00* (2013.01); *G01R 31/3648* (2013.01); *H04L 12/40032* (2013.01);
(Continued)

(58) Field of Classification Search
CPC ............... H04Q 9/00; H04L 12/40032; H04L 2012/40215; G01R 31/3648; H01M 2010/4271; H01M 2010/4278
See application file for complete search history.

(56) References Cited

U.S. PATENT DOCUMENTS

| 6,084,380 A | 7/2000 | Burton |
| 7,576,517 B1 | 8/2009 | Cotton et al. |
| (Continued) | | |

FOREIGN PATENT DOCUMENTS

| DE | 19951753 | 5/2000 |
| DE | 102010041492 | 3/2012 |
| (Continued) | | |

OTHER PUBLICATIONS

International Search Report for Application No. PCT/EP2014/066714 dated Nov. 6, 2014 (English Translation, 3 pages).

*Primary Examiner* — Drew A Dunn
*Assistant Examiner* — Sailesh Thapa
(74) *Attorney, Agent, or Firm* — Michael Best & Friedrich LLP

(57) ABSTRACT

Electromechanical adapter having at least one controller, wherein the adapter comprises at least a first interface for communication with at least one monitoring unit at the battery, a second interface for communication with a monitoring unit that is superordinate to the monitoring unit at the battery, and a third interface for the connection of at least one sensor and/or actuator, wherein the controller converts signals between the first and second interfaces.

11 Claims, 5 Drawing Sheets

(51) Int. Cl.
*G01R 31/36* (2006.01)
*H01M 10/42* (2006.01)

(52) U.S. Cl.
CPC .............. *H01M 2010/4271* (2013.01); *H01M 2010/4278* (2013.01); *H04L 2012/40215* (2013.01)

(56) References Cited

U.S. PATENT DOCUMENTS

| | | | |
|---|---|---|---|
| 2010/0023205 A1* | 1/2010 | Schmitt | B60W 40/11 701/29.2 |
| 2010/0071979 A1 | 3/2010 | Heichal et al. | |
| 2011/0245987 A1 | 10/2011 | Pratt et al. | |
| 2013/0138861 A1* | 5/2013 | Terlizzi | G06F 21/44 710/316 |
| 2015/0309121 A1* | 10/2015 | Butzmann | G01R 31/3658 324/434 |

FOREIGN PATENT DOCUMENTS

| | | |
|---|---|---|
| DE | 102010062872 | 6/2012 |
| DE | 102012017184 | 3/2014 |
| JP | 2009076264 | 4/2009 |
| JP | 2009250615 | 10/2009 |
| JP | 2012084459 | 4/2012 |
| WO | 2012095202 | 7/2012 |

\* cited by examiner

ELECTROMECHANICAL ADAPTER FOR COMMUNICATING BETWEEN INTERFACES

BACKGROUND OF THE INVENTION

The invention is based on an electromechanical adapter having at least one controller.

Adapters are known from the prior art that convert signal levels between two interfaces so that it is possible, for instance, to operate different sensors from one controller.

SUMMARY OF THE INVENTION

The disadvantage with the known prior art is that each adapter requires a dedicated hardware circuit and also each unit which is connected to the interfaces of the adapter has a dedicated evaluation circuit.

In contrast, the procedure according to the invention has the advantage that the electromechanical adapter comprises at least one controller, wherein the adapter comprises at least one first interface for communication with at least one battery-side monitoring unit, a second interface for communication with a monitoring unit that is at a higher level than the battery-side monitoring unit, and a third interface for interfacing at least one sensor and/or actuator, wherein the controller converts signals between the first interface and the second interface.

The electromechanical adapter advantageously comprises at least one further component for converting the signals, for instance a CAN-bus controller and/or a programmable component. The programmable component can be used, for instance, to adapt the conversion of the signals to new communications protocols without the need to replace the additional component and/or the electromechanical adapter.

The first interface comprises a serial interface, which advantageously transmits data asynchronously and comprises error detection and/or error correction, whereby communication errors are detected.

The first interface, the second interface and/or the third interface advantageously comprise plug-in connections in order to be able to optimize the installation space when using the electrical mechanical adapter, and/or the electrochemical adapter is detachably connected, for instance, to a control unit, a communications line, a sensor, an actuator and/or a monitoring unit.

The controller of the electromechanical adapter advantageously comprises a procedure that converts signals between the first interface and the second interface by adapting a signal waveform and/or a signal level of the signals.

In another embodiment, the signals are converted according to a sensor signal from the third interface, wherein by means of the sensor signal from the third interface, the controller advantageously adapts the signal conversion between the first interface and the second interface and/or performs an error handling procedure.

The controller advantageously performs a plausibility check on the signals, for example by a signal-comparison of signals that are acquired by different measurement methods and/or different sensors, and/or compares signals with defined threshold values for extreme values and/or average values.

In a first advantageous embodiment, the controller can thereby block signals that lie outside the defined threshold values, thereby preventing consequential faults, for example resulting from a voltage exceeding a maximum level.

In a second embodiment, the controller uses stored substitute values for the signals. For example, the stored maximum threshold value is used if a signal exceeds this maximum threshold value.

In a third embodiment, the controller adapts a sampling frequency for the signal acquisition. For instance, the sampling frequency is increased if the compared signals differ from one another within a tolerance range in order to ensure a normal state is detected in good time. When the compared signals no longer differ from one another, the sampling frequency is reduced again.

In a fourth embodiment, the controller actuates an actuator if the signals differ from one another in the plausibility check. The controller advantageously outputs an alarm signal so that further monitoring units can take error-handling measures, for example disconnecting a battery from an electrical drive of a vehicle by opening contactors.

The controller advantageously uses the signal waveform and/or the signal level to detect signal-acquisition errors, for example faulty sensors, defective cables, and/or to detect communication errors, for instance interference coupled into an electrical line between the electromechanical adapter and a further control unit. The controller outputs an alarm signal to the third interface on the basis of the plausibility check.

The electromechanical adapter is used in a battery-side monitoring unit and/or in a communications connection between a battery-side monitoring unit and a central monitoring unit that is at a higher level than the battery-side monitoring unit and/or in a central monitoring unit that is at a higher level than the battery-side monitoring unit, advantageously by using the detachable plug-in connection of the electromechanical adapter to disconnect and reconnect the communications lines.

BRIEF DESCRIPTION OF THE DRAWINGS

Exemplary embodiments of the invention are explained in greater detail in the following description, and are illustrated in the drawing, in which.

DETAILED DESCRIPTION

The same reference signs are used in all the figures to denote identical device components.

Figure 1:
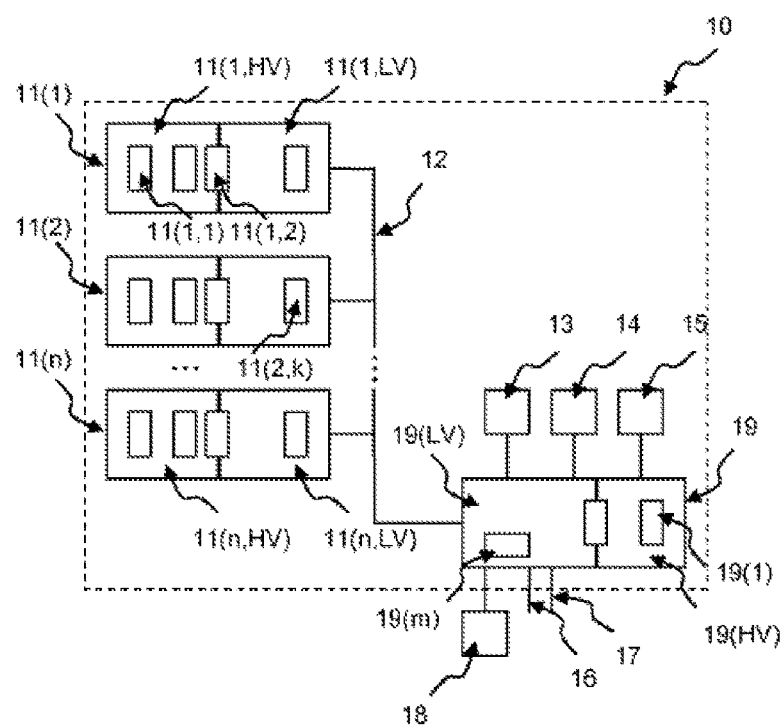
FIG. 1 shows a battery management architecture according to the prior art.

FIG. 1 shows a battery management system (BMS) having a battery management architecture 10 according to the prior art. At least one monitoring unit 11(1), 11(2), 11(n) for monitoring at least one battery cell is connected via communications bus 12 to a central control unit 19 (battery control unit, BCU) by means of a communications interface.

The monitoring unit 11(1), 11(2), 11(n) for monitoring the at least one battery cell comprises, for instance, a high-voltage stage 11(1,HV), 11(n,HV) and, for instance, a low-voltage stage 11(1,LV), 11(n,LV), and at least one further component 11(1,1), 11(1,2), 11(2,k), for example for connecting the high-voltage stage 11(1,HV), 11(n,HV) and the low-voltage stage 11(1,LV), 11(n,LV), and/or a communications driver for the communications bus 12.

The central control unit 19 comprises a high-voltage stage 19(HV) and a low-voltage stage 19(LV) and at least one further component 19(1), 19(m), for example for connecting the high-voltage stage 19(HV) and the low-voltage stage 19(LV), and/or a communications driver for the communications bus 12. The central control unit 19 comprises further communications connections, for instance for receiving signals from at least one sensor and/or actuating at least one actuator. The at least one sensor is, for example, a shunt sensor 15 connected to the high-voltage stage 19(HV) and/or a Hall sensor 14 connected to the low-voltage stage 19(LV). The at least one actuator comprises, for example, a unit 13 (battery disconnect unit, BDU) for galvanic isolation of the high-voltage stage 19(HV) between a battery, which comprises at least one battery cell, and a charging station for charging the battery.

The central control unit 19 is connected via the at least one further component 19(1), 19(m) to at least one further component 18, for example to a central vehicle control unit (VCU). In addition, the central control unit 19 comprises further communications connections 16, 17 in order to receive a signal, for instance from a high-voltage interlock circuit and/or from a signal occurring in a car accident detected by the further unit 18. If, for example, the high-voltage interlock circuit is broken, the central control unit 19 actuates the unit 13 and disconnects the battery from the charging station.

Figure 2A:
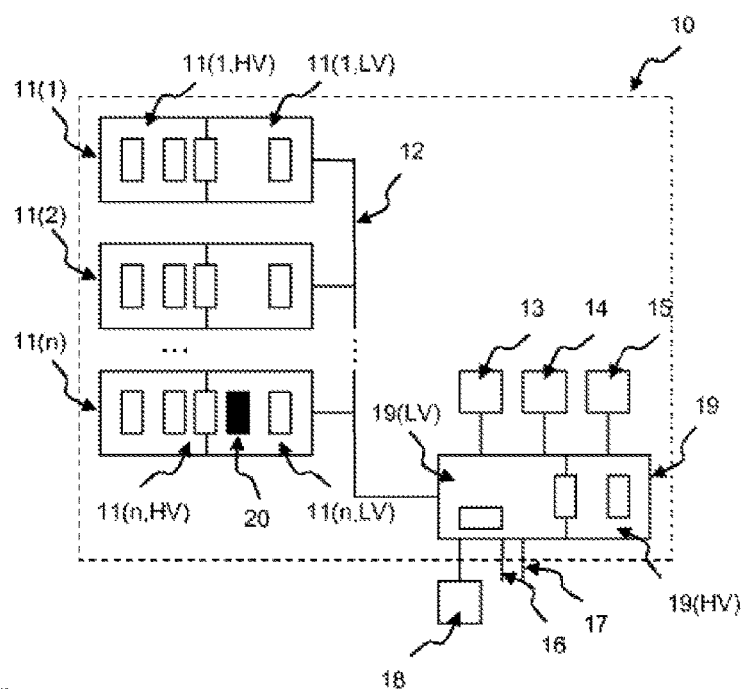
FIG. 2a shows an example of a use of the electromechanical adapter according to the invention in a battery-side monitoring unit.

FIG. 2a shows an example of a use of the electromechanical adapter 20 according to the invention in a battery-side monitoring unit 11(n). In another embodiment, each battery-side monitoring unit 11(1), 11(2), 11(n) comprises an electromechanical adapter 20. Advantageously, the monitoring units 11(1), 11(2), 11(n) are intrinsically safe in this embodiment, because monitoring for a thermal runaway of the battery cell takes place in the monitoring unit 11(1), 11(2), 11(n) and is communicated with central control units by means of the electromechanical adapter 20.

Figure 2B:
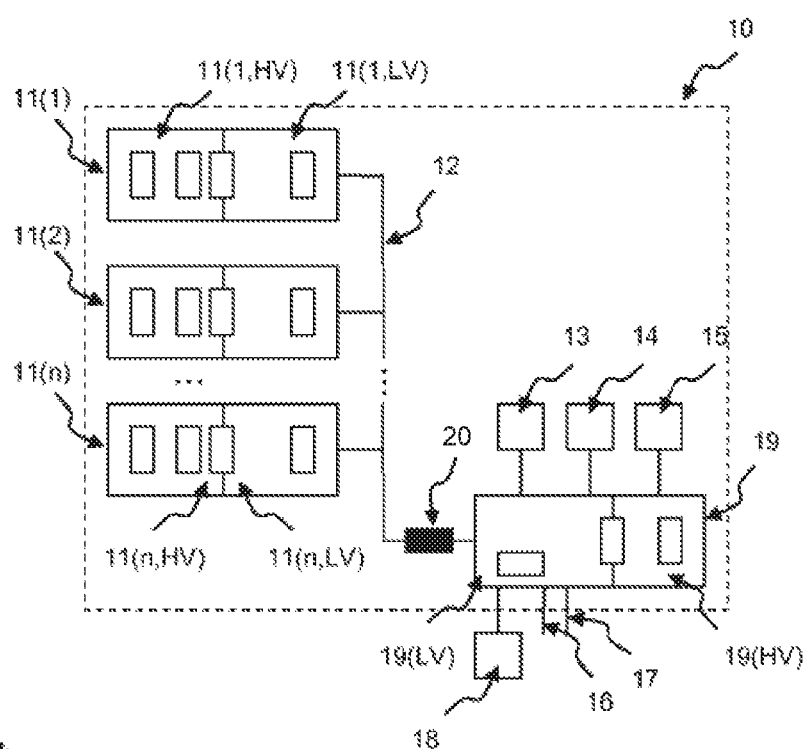
FIG. 2b shows an example of a use of the electromechanical adapter according to the invention in a communications connection between a battery-side monitoring unit and a central monitoring unit that is at a higher level than the battery-side monitoring unit.

FIG. 2b shows an example of the use of the electromechanical adapter 20 according to the invention in a communications connection 12 between a battery-side monitoring unit 11(n) and a central monitoring unit 19 that is at a higher level than the battery-side monitoring unit (11(1), 11(2), 11(n).

Figure 2C:
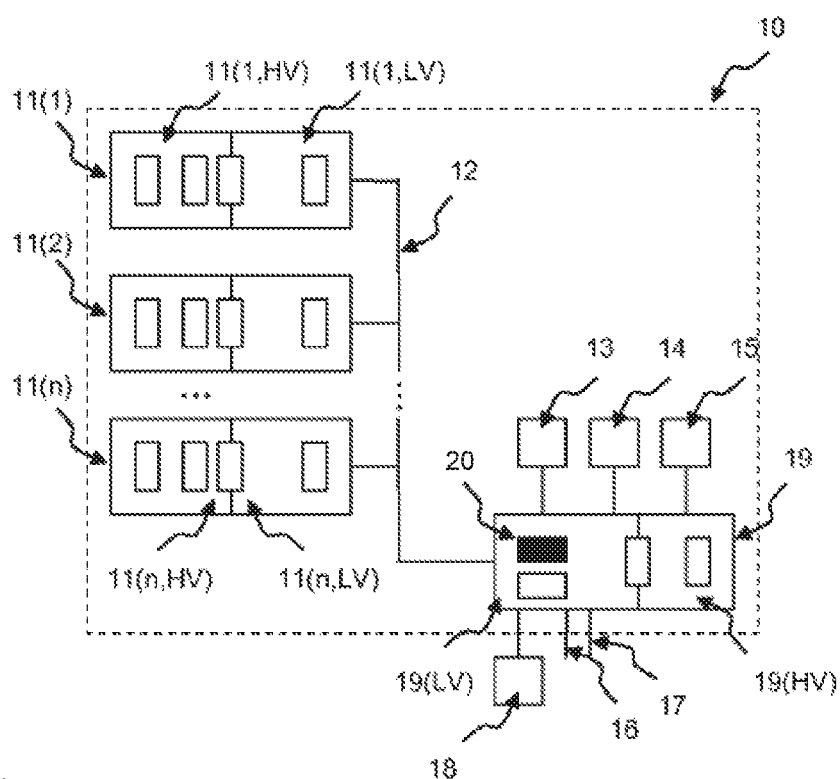
FIG. 2c shows an example of a use of the electromechanical adapter according to the invention in a central monitoring unit that is at a higher level than the battery-side monitoring unit.

FIG. 2c shows an example of a use of the electromechanical adapter 20 according to the invention inside a central monitoring unit 19 that is at a higher level than the battery-side monitoring unit (11(1), 11(2), 11(n).

In a first embodiment, the central monitoring unit 19 advantageously fully contains the electromechanical adapter 20, for example in the form of a circuit board arranged in a housing of the central monitoring unit 19, wherein at least one interface of the electromechanical adapter 20 is connected via a further interface to a communications connection 12.

In a second advantageous embodiment, the central monitoring unit 19 contains the electromechanical adapter 20 in the sense that the at least one interface of the electromechanical adapter 20 is connected directly to the communications connection 12.

Figure 3:
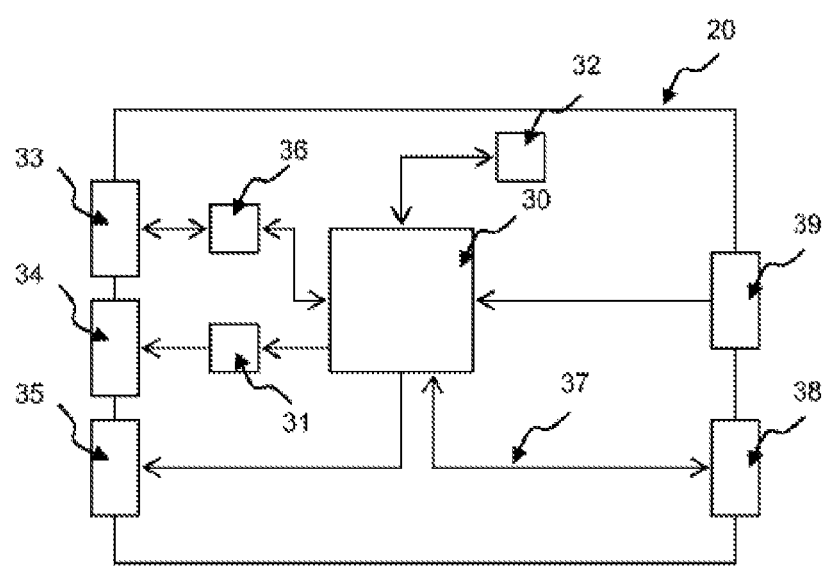
FIG. 3 shows an embodiment of the electromechanical adapter according to the invention.

FIG. 3 discloses an embodiment of the electromechanical adapter 20 according to the invention comprising at least one controller 30. The electromechanical adapter 20 is connected via at least one interface 38 to at least one battery-side monitoring unit (11(1), 11(2), 11(n) by means of a communications connection 12. The communications connection 12 is advantageously a serial interface, for example a UART (universal asynchronous receiver transmitter) or an SPI (serial peripheral interface).

The electromechanical adapter 20 comprises at least one interface 33, 34 for communication between a central control unit 19, for example a monitoring unit that is at a higher level than the battery-side monitoring unit (11(1), 11(2), 11(n), and/or a further control unit. For communication between the controller 30 and the central control unit 19, the electromechanical adapter 20 comprises at least one further component 31, 36, for example a CAN-bus controller, and/or comprises at least one programmable component, for instance a component such as a CPLD (complex programmable logic device) or an FPGA (field programmable gate array).

Signals between the first interface (38) and the second interface (33, 34) are converted by the controller (30) and/or by a further component (31, 36) of the electromechanical adapter (20) by adapting a signal waveform and/or a signal level. It is thereby advantageously possible to convert the signals from a first communications protocol of the first interface into a second communications protocol of the second interface, in which process a value range and/or a physical entity of a signal message is also converted, for example.

The electromechanical adapter 20 comprises at least one further interface, for example an interface 39 for an overvoltage signal and/or undervoltage signal and/or a resistance of a thermistor (negative temperature coefficient thermistor, NTC), and an interface 35 for actuating at least one actuator.

The electromechanical adapter 20 comprises at least one further component 32, such as a watchdog, for example, which is advantageously connected to the controller 30 via an SPI (serial peripheral interface).

The electromechanical adapter 20 and/or the at least one further component 31, 36 advantageously converts signals between the first interface 38 and/or the second interface 33, 34 and the third interface 35, 39.

The invention claimed is:

1. An electromechanical adapter comprising:
    at least one controller,
    at least one first interface for communication with at least one battery-side monitoring unit,
    a second interface for communication with a monitoring unit that is connected to a central control unit, and
    a third interface for interfacing at least one selected from the group consisting of a sensor and an actuator,
    wherein the controller converts signals between the first interface and the second interface based on a sensor signal from the third interface, and
    wherein the first interface and second interface have different communication protocols.

2. The electromechanical adapter as claimed in claim 1, further comprising at least one component for converting the signals.

3. The electromechanical adapter as claimed in claim 2, wherein the at least one component comprises a CAN-bus controller, a programmable component, or both.

4. The electromechanical adapter as claimed in claim 1, wherein the first interface is a serial interface.

5. The electromechanical adapter as claimed in claim 1, wherein the first interface, the second interface and/or the third interface comprise plug-in connections.

6. A method for operating an electromechanical adapter having at least one controller, the method comprising:
    converting signals between a first interface and a second interface using at least one selected from a group consisting of the controller and a component of the electromechanical adapter by adapting at least one selected from a group consisting of a signal waveform and a signal level,
    wherein the first interface and the second interface have different communication protocols, and
    wherein the signals are converted based on a sensor signal from a third interface of the electromechanical adapter.

7. The method as claimed in claim 6, wherein the controller performs a plausibility check on the signals.

8. The method as claimed in claim 7, wherein the controller performs the plausibility check by a signal-comparison of signals that are acquired by different measurement methods and/or different sensors, and/or compares signals with defined threshold values for extreme values and/or average values.

9. The method as claimed in claim 8, wherein the controller blocks signals that lie outside the defined threshold values, uses stored substitute values for the signals, adapts a sampling frequency for the signal acquisition and/or actuates an actuator if the compared signals differ from one another.

10. The method as claimed in claim 6, wherein the controller uses the signal waveform and/or the signal level to detect errors.

11. The method as claimed in claim 6, wherein the controller outputs an alarm signal to the third interface on the basis of the plausibility check, errors or both.

\* \* \* \* \*